(12) United States Patent
Chari

(10) Patent No.: US 7,614,022 B1
(45) Date of Patent: Nov. 3, 2009

(54) TESTING FOR BRIDGE FAULTS IN THE INTERCONNECT OF PROGRAMMABLE INTEGRATED CIRCUITS

(75) Inventor: Madabhushi V. R. Chari, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 181 days.

(21) Appl. No.: 11/633,921

(22) Filed: Dec. 5, 2006

(51) Int. Cl.
*G06F 17/50* (2006.01)
(52) U.S. Cl. .................................. 716/4; 716/1; 716/17
(58) Field of Classification Search ...................... 716/1, 716/4, 17
See application file for complete search history.

(56) References Cited

U.S. PATENT DOCUMENTS 5,146,592 A * 9/1992 Pfeiffer et al. .............. 715/807
5,717,701 A * 2/1998 Angelotti et al. ............. 714/30

OTHER PUBLICATIONS

Michael R. Garey et al.; "An Application of Graph Coloring to Printed Circuit Testing"; IEEE Transactions on Circuits and Systems; vol. CAS-23; No. 10; Oct. 1976; pp. 591-599.

* cited by examiner

*Primary Examiner*—Thuan Do
(74) *Attorney, Agent, or Firm*—Thomas A. Ward; Michael T. Wallace; Thomas George

(57) ABSTRACT

Apparatus and methods of testing for bridge faults in nets of the interconnect of a programmable integrated circuit. Each net is sourced by a function generator (e.g., a look up table) configured as a clocked shift register. For each net group, shift registers connecting nets in the group are initialized identically to one value and are initialized to a different unique value from shift registers connecting nets of other net groups. Each shift register stores one bit with a value one and zeros in all other bits. When the shift register is clocked, it provides a single one on one clock cycle and provides zeros in all other clock cycles. At the end of n clock cycles, where n is the length of the shift register, if the load on any net has a value that is different from the value provided by the net's corresponding shift register, a short is detected.

20 Claims, 4 Drawing Sheets

| Net Group No. | Initialization of 16 bits |
|---|---|
| 1 | 0x0001 = 0000 0000 0000 0001 |
| 2 | 0x0002 = 0000 0000 0000 0010 |
| 3 | 0x0004 = 0000 0000 0000 0100 |
| 4 | 0x0008 = 0000 0000 0000 1000 |
| 5 | 0x0010 = 0000 0000 0001 0000 |
| 6 | 0x0020 = 0000 0000 0010 0000 |
| 7 | 0x0040 = 0000 0000 0100 0000 |
| 8 | 0x0080 = 0000 0000 1000 0000 |
| 9 | 0x0100 = 0000 0001 0000 0000 |
| 10 | 0x0200 = 0000 0010 0000 0000 |
| 11 | 0x0400 = 0000 0100 0000 0000 |
| 12 | 0x0800 = 0000 1000 0000 0000 |
| 13 | 0x1000 = 0001 0000 0000 0000 |
| 14 | 0x2000 = 0010 0000 0000 0000 |
| 15 | 0x4000 = 0100 0000 0000 0000 |
| 16 | 0x8000 = 1000 0000 0000 0000 |

FIG. 3

Shift Registers for Net Group 5

| Clock | 16 bits of register | Data Out |
|---|---|---|
| t0 | 0000 0000 0001 0000 | N/A |
| t1 | 0000 0000 0000 1000 | 0 |
| t2 | 0000 0000 0000 0100 | 0 |
| t3 | 0000 0000 0000 0010 | 0 |
| t4 | 0000 0000 0000 0001 | 0 |
| t5 | 0000 0000 0000 0000 | 1 |

FIG. 4

TESTING FOR BRIDGE FAULTS IN THE INTERCONNECT OF PROGRAMMABLE INTEGRATED CIRCUITS

FIELD OF THE INVENTION

The present invention relates generally to testing bridge faults in the interconnect of programmable integrated circuit.

BACKGROUND

A programmable integrated circuit, is a class of integrated circuits for which the logic function is defined by the customer using development system software after the IC has been manufactured and delivered to the end user. For example, one type of programmable integrated circuit, a field programmable gate array (FPGA), is an integrated circuit chip that includes programmable interconnect circuitry for interconnecting programmable components such as configurable logic blocks (CLBs), programmable input/output buffers (IOBs), and block random access memory (BRAMs). The CLBs include a number of function generators that can be configured as look up tables (LUTs), random access memories (RAMs), read-only memories (ROMs) or shift registers. Although the term LUT is referenced hereafter, any type of function generator may be used instead of a LUT. LUTs are typically made up of components such as multiplexers and static random access memory (SRAM) configuration memory cells. These SRAM memory cells can be programmed to configure the logic in the LUTs. Each LUT implements a logic function depending on how the SRAM memory cells are programmed or configured. A few of the possible logic functions that a LUT can implement are: AND, OR, and XOR gates. LUTs can be programmed to perform other functions such as an adder, multiplier, or shift register.

Classical methods of testing for bridge faults or shorts in the interconnect of FPGA devices involves driving one net of the interconnect at a time to one binary value and all other nets to the opposite binary value. A net forms an electronic connection between components. It can also form a connection from a single component to an IOB. A bridge fault is a short circuit between two nets. If the loads on the nets are observed to have different than expected values, then shorts are present in the device. A device tester is used to run test patterns and observe the net loads. Examples of device testers are the Teradyne J750 or Teradyne FLEX. By repeatedly dividing the nets into smaller groups, shorted nets are detected. This takes a long test time and requires multiple test configurations. The number of nets that need to be tested in order to provide realistic bridge fault coverage can be reduced by analyzing the physical layout and finding which resources can be "short candidates." This analysis, however, can also take a long time.

What is needed is a way to test bridge faults in the interconnect of programmable integrated circuits such as FPGAs, quickly and comprehensively, and without multiple configurations of the programmable integrated circuit.

SUMMARY

Embodiments of the present invention provide for testing for bridge faults in nets of the interconnect of programmable integrated circuits (e.g., field programmable gate arrays, or FPGAs). To test a large number of nets simultaneously, source function generators (e.g., look up tables, or LUTs) that are coupled to the nets are configured as shift registers. Exemplary programmable integrated circuits provide a shift register length that includes, but is not limited to, 16, 32 or 64 bits. For example, four slices in a configurable logic block (CLB) of one particular FPGA can be cascaded together to create a shift register of length of 64. For an FPGA providing a shift register length of n, up to n groups of nets can be tested at a time. Thus, only one configuration of the FPGA is needed to test the nets.

Each net is sourced by a function generator configured as a clocked shift register. For each net group, shift registers coupling together nets in the group are initialized identically to one value and are initialized to a different unique value from shift registers connecting nets of other net groups. In some embodiments, each of the shift registers stores one bit with a value one and with zeros in all other bits. When the shift register is clocked, it provides a single one on one clock cycle and provides zeros in all other clock cycles. In other embodiments, each of the shift registers stores one bit with a value of zero and ones in all other bits. When the shift register is clocked, it provides a single zero on one clock cycle and provides ones in all other clock cycles. At the end of n clock cycles, where n is the length of the shift register, when the load on any net has a value that is different from the value provided by the net's corresponding shift register, a short is detected.

BRIEF DESCRIPTION OF THE DRAWINGS

Further details of the present invention are explained with the help of the attached drawings, in which:

FIG. 3 shows a complete list of shift register initialization for the sixteen net groups of FIG. 2, according to embodiments of the invention;

FIG. 4 shows shift register values for a series of clock cycles for an example shift register of FIG. 2 set according to embodiments of the invention.

DETAILED DESCRIPTION

Figure 1:
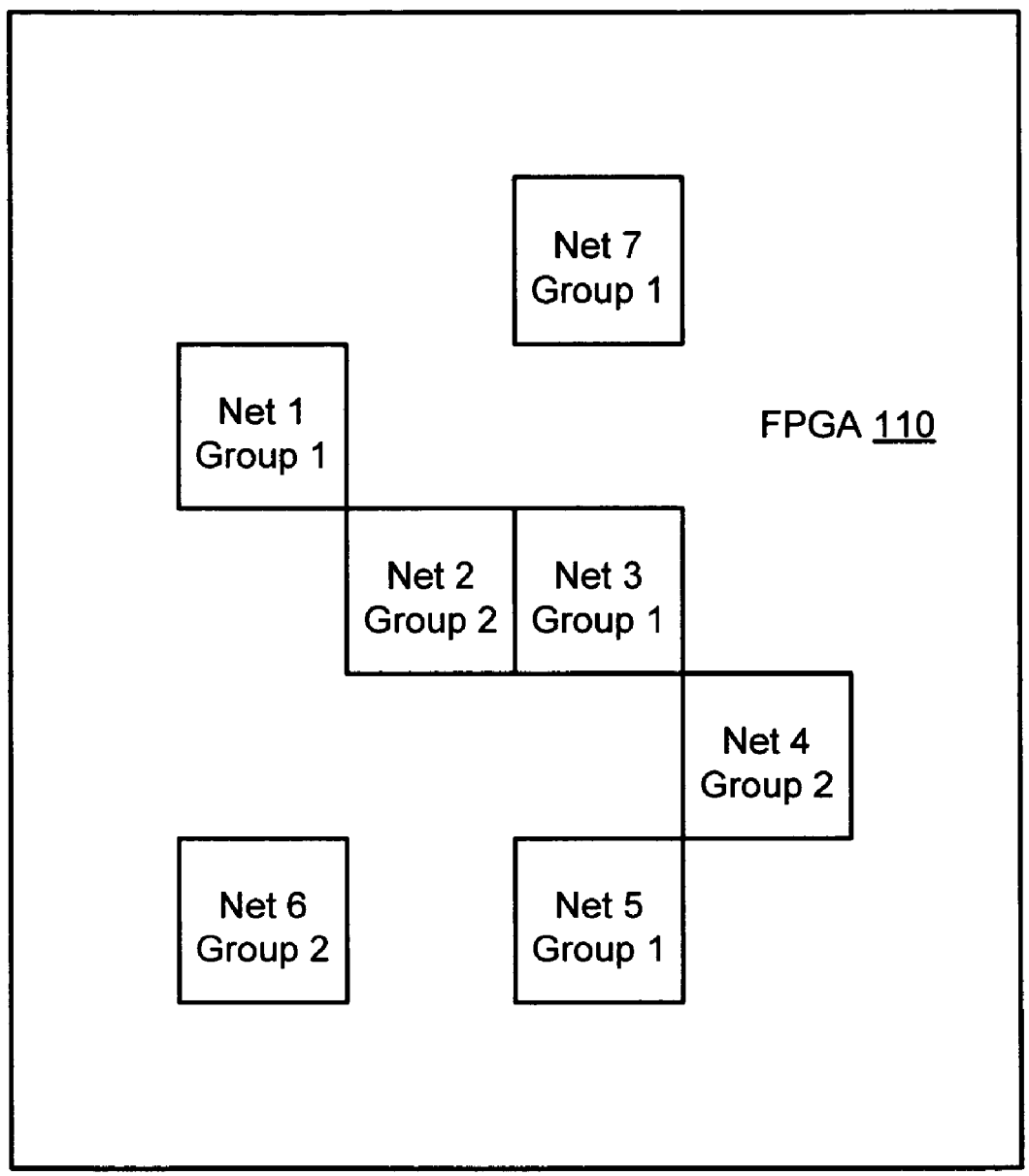
FIG. 1 illustrates an example of two groupings of nets within an FPGA, according to embodiments of the invention.

FIG. 1 illustrates an example of two groupings of nets within an FPGA 110 according to embodiments of the invention. The arrangement takes advantage of the fact that if nets in a group cannot be shorted to each other, then shorts between multiple groups of nets can be tested. Grouping of nets allows groups of nets to be tested simultaneously. This speeds up the testing process in terms of the number of patterns required to comprehensively test for shorts between nets or groups of nets.

Nets in the same group should be disjoint so they cannot be shorted to each other. A group can contain one or more nets, and the number of nets in a group can be dependent upon the design topology or net ordering. In FIG. 1, seven example nets are shown as "Net 1" through "Net 7." At most seven groups of nets can be formed from these nets. At least two groups of nets must be formed because some of the nets can be shorted to each other. For example, "Net 1" and "Net 2" will not be selected for the same group of nets because they are not disjoint and can be shorted to each other. In FIG. 1, an example two groups of nets is formed. "Net 1," "Net 3," and "Net 5" can be selected for the same group because they are disjoint. Thus, "Net 1," "Net 3," and "Net 5" are part of "Group 1," and "Net 2" and "Net 4" are part of "Group 2."

"Net 6" and "Net 7" can be part of either group but are shown in FIG. 1 as part of "Group 2" and "Group 1," respectively.

Further, embodiments of the invention take advantage of the fact that a look up table (LUT) can be configured as a shift register, which can generate any stimulus pattern in order to test for shorts on the interconnect of FPGA devices. A LUT implements Boolean functions. A shift register is a group of registers set up in a linear fashion which have their inputs and outputs coupled together in such a way that the data is shifted down the line when the circuit is activated. FPGAs provide a shift register length that includes, but is not limited to, 16, 32 or 64 bits. The shift register length of an FPGA corresponds to the number of groups of nets that can be tested simultaneously. Thus, for shift register lengths of 16, 32 or 64 bits, up to 16 groups, up to 32 groups and up to 64 groups of nets, respectively, can be tested simultaneously.

Figure 2:
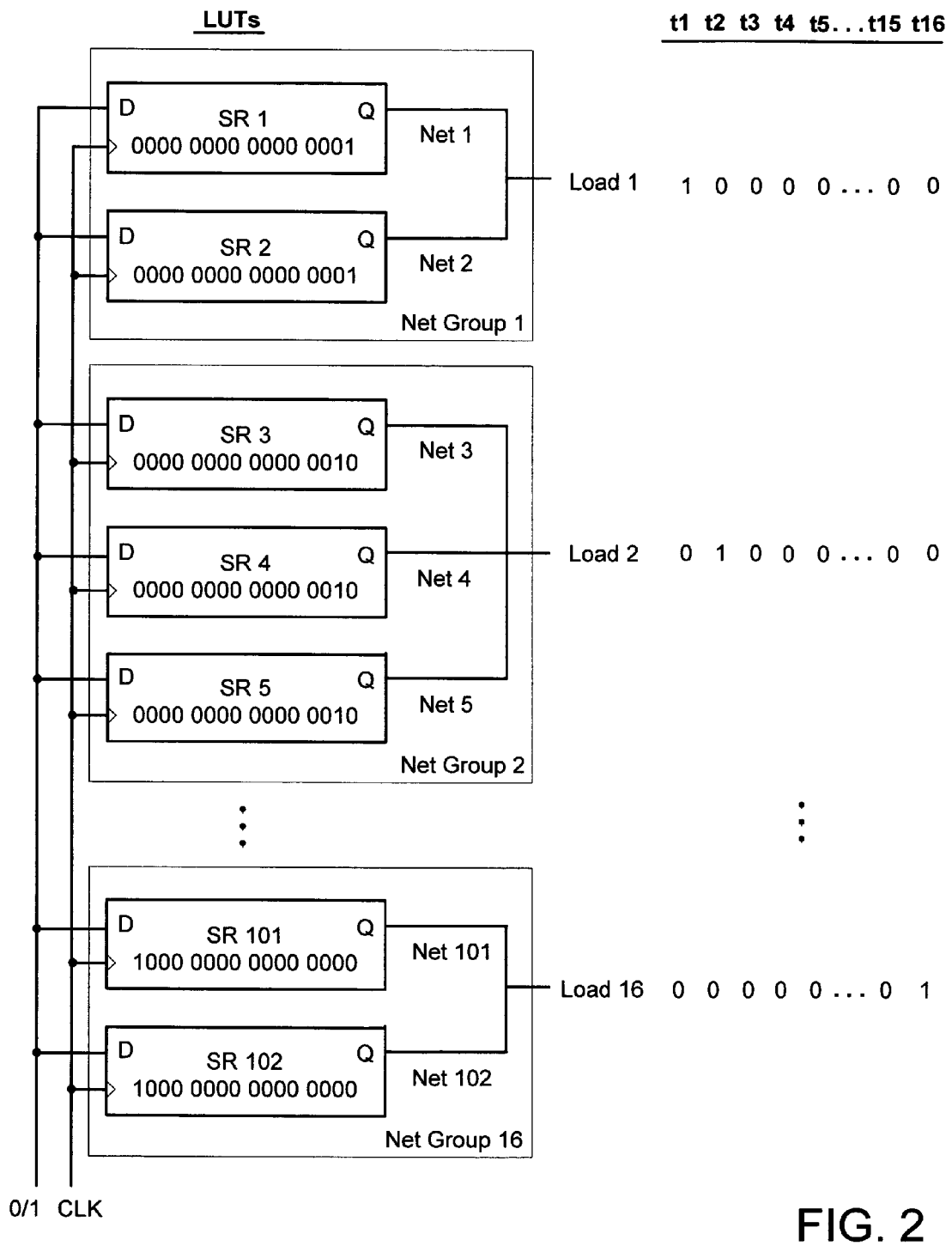
FIG. 2 illustrates LUTs of an example FPGA configured as shift registers and clocked together to test an example 16 net groups, according to embodiments of the invention.

FIG. 2 illustrates LUTs of an example FPGA configured as shift registers and clocked together to test an example 16 net groups, according to embodiments of the invention. The shift registers in this example have a length of 16 bits, as provided by the example FPGA. For these 16-bit shift registers, up to sixteen groups of nets can be tested for shorts simultaneously. Only three groups of nets are shown in this example, for the sake of clarity. The groups of nets can contain one or more nets. These groups of nets are selected as discussed above for FIG. 1. The three example groups of nets are "Net Group 1," "Net Group 2," and "Net Group 16." An example two nets, "Net 1" and "Net 2," are selected for "Net Group 1." An example three nets, "Net 3," "Net 4," and "Net 5," are selected for "Net Group 2." An example two nets, "Net 101" and "Net 102," are selected for the final net group, "Net Group 16." Thus, in this example, 102 nets will be tested.

Source LUTs for the nets "Net 1" through "Net 5," "Net 101," and "Net 102" in the figure are labeled as shift registers 1-5 and 101-102, or "SR 1" through "SR 5," "SR 101," and "SR 102." Each LUT effectively works as a shift register and in the following description will be referred to as shift registers. The shift registers are clocked together by "CLK." Each shift register also has a data in, shown as "D," as well as a data out, shown as "Q." For "Net Group 1," the shift registers corresponding to the nets in this group are initialized to the same value, 0x0001 hexadecimal. For "Net Group 2," the shift registers corresponding to the nets in this group are initialized to the same value, 0x0002 hexadecimal. For "Net Group 16," the shift registers corresponding to the nets in this group are initialized to the same value, 0x8000 hexadecimal. For each of the 16 net groups, the 16 bit shift register values are initialized as shown in FIG. 3.

FIG. 3 shows a complete list of shift register initializations for the sixteen net groups of FIG. 2, according to some embodiments of the invention, since only seven of the shift registers are shown in FIG. 2. Thus, FIG. 3 shows that the source LUTs of nets in "Net Group 1" in FIG. 2 are configured as shift registers and initialized to 0x0001 hexadecimal. The source LUTs of nets in "Net Group 2" are configured as a shift registers and initialized to 0x0002 hexadecimal. This initialization continues for net groups 3 through 15 until the source LUTs of nets in "Net Group 16" are configured as a shift registers and initialized to 0x8000 hexadecimal. The values of the shift registers as initialized are the values the shift registers have at time 0, or t0 (not shown in FIG. 2), or before the CLK in FIG. 2 is set high for the first time.

In FIG. 2, for the groups of nets to be tested, shown as "Net Group 1," "Net Group 2," and "Net Group 16," each net of each group can have one or more connected loads. For the sake of simplicity, the nets shown in FIG. 2 each have one load. The net loads for a group are scan-chained, and the data is read out from an I/O pad of the FPGA. The data read out of the scan-chain for each group is shown as "Load 1" for "Net Group 1," "Load 2" for "Net Group 2," and "Load 16" for "Net Group 16." If a shift register data out, or "Q," has a value of 1, as discussed below, then all loads for the nets in the group coupled to the shift register should have a value of 1. If one or more of these loads has a value of 0, however, the data read out of the scan-chain has a value of 0, indicating a short is detected. Conversely, if a shift register data out, or "Q," has a value of 0, as discussed below, then all loads for the nets in the group coupled to the shift register should have a value of 0. If one or more these loads has a value of 1, however, then the data read out of the scan-chain has a value of 1, indicating a short is detected.

The loads can be tested through the use of a number of devices. For example, a Teradyne J750 or Teradyne FLEX test device can be used. The loads, or I/O pads of the FPGA, are coupled to a socket on the device tester. In embodiments, for an FPGA shift register length of 16, the device tester can test net loads for one to 16 groups of nets at a time.

On the right side of FIG. 2 are the values that the sources and corresponding loads should have after each clock cycle, "t1" through "t5," "t15," and "t16." If after a clock cycle a load does not have the value shown in FIG. 2, a default or short has been detected between the net group corresponding to the load and an adjacent net group.

Starting from time t0, on a first clock cycle when the CLK in FIG. 1 is set high, the bits in all shift registers are shifted one bit to the right. The current CLK time of t1 is shown. The data in or "D" bit shifted into each register is a "don't care" because after 16 clock cycles, all initialized bits will have been shifted out of the registers. Thus, the "D" bit can be either a 1 or a 0. The data out or "Q" bit shifted out of each register is the first bit of the register. At time t1, the "Q" bit of "SR 1" and "SR 2" is 1, while "0" bits for all other shift registers is 0. For "SR 1" and "SR 2," the "Q" bit of "1" is the source for "Net 1" and "Net 2." "Load 1" should have a value of 1, otherwise a fault or short is detected between "Net Group 1" and "Net Group 2." Similarly the "Q" bit of "0" is the source for all other nets, and the loads for the nets' corresponding net groups should have a value of 0, otherwise a fault or short is detected between whichever net group has a load with a value of 1 and any adjacent net groups. For example, if "Load 2" for "Net Group 2" has a value of 1, a fault or short is detected between "Net Group 2" and "Net Group 1" or between "Net Group 2" and "Net Group 3" (not shown).

On a second clock cycle when CLK is set high, the bits in all shift registers are shifted one bit to the right. The current CLK time of t2 is shown. The data in or "D" bit shifted into each register is again a "don't care." The data out or "Q" bit is shifted out of each register. At time t2, the "0" bit of "SR 3," "SR 4," and "SR 5" is 1, while "Q" bits for all other shift registers is 0. For "SR 3," "SR 4," and "SR 5," the "Q" bit of "1" is the source for "Net 3," "Net 4," and "Net 5." "Load 2" should also have a value of 1, otherwise a fault or short is detected between "Net Group 2" and "Net Group 1" or between "Net Group 2" and "Net Group 3" (not shown). Similarly, the "Q" bit of "0" is the source for all other nets, and the loads for the nets' corresponding net groups should have a value of 0, otherwise a fault or short is detected between whichever net group has a load with a value of 1 and any adjacent net groups.

On the third through sixteenth clock cycles when CLK is set high, "Net Group 3" (not shown) through "Net Group 16" are tested in a similar manner as "Net Group 2." After this sixteenth clock cycle, the testing of the sixteen net groups is finished. Thus, sixteen net groups can be efficiently tested at a time in one configuration.

FIG. 4 shows shift register values for a series of clock cycles for an example shift register of FIG. 2, set according to embodiments of the invention. The example shift register is for the FIG. 2 "Net Group 5" (not shown). The shift register is initialized to 0x0010 hexadecimal, or 0000 0000 0001 0000 binary, at time t0, before any clock cycles. For each of clock cycles t1 through t4, the bits of the shift register are shifted once to the right, and the resulting bit shifted out of the register, or "Data Out" is 0. On the fifth clock cycle, the resulting bit shifted out of the register, or "Data Out" is 1. These bit values test any nets in "Net Group 5."

In FIGS. 2, 3 and 4, each of the shift registers can instead be initialized to store one bit with a value of zero and the remaining bits with a value of one. It can be appreciated that the nets can then be tested as described above for FIG. 2 but will be tested for opposing values than those described above for FIG. 2.

Figure 5:
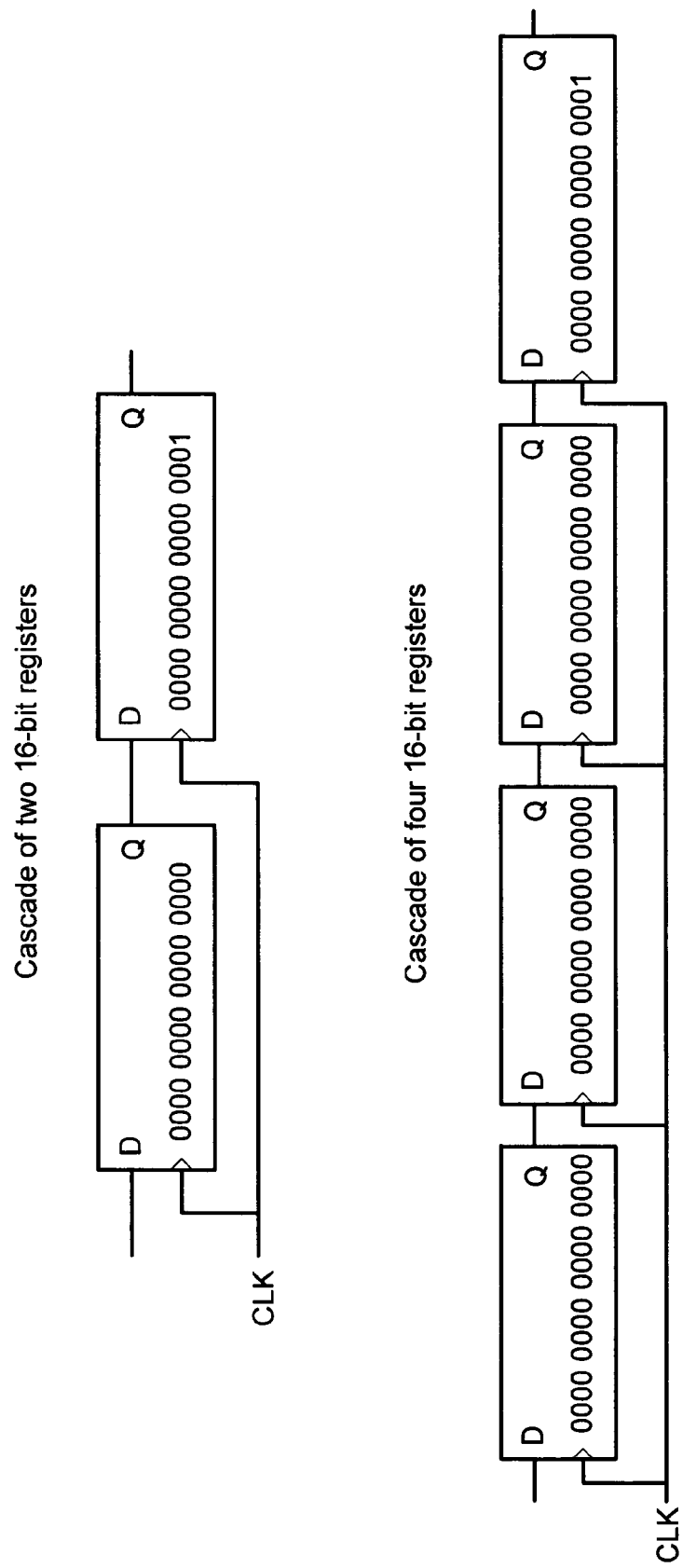
FIG. 5 illustrates cascading shift registers to enable testing of larger numbers of net groups at one time, according to embodiments of the invention.

FIG. 5 illustrates cascading shift registers to enable testing of larger numbers of net groups at one time, according to embodiments of the invention. By cascading two 16-bit shift registers, thirty-two net groups at a time can be tested, as shown in FIG. 5. Similarly, in some embodiments, by cascading four 16-bit shift registers, sixty-four net groups at a time can be tested, as shown in FIG. 5. Other embodiments can include cascading any number of different length registers to test any number of net groups.

In some embodiments of the present invention, an alternate method of determining which net groups can be shorted can be used. For example, instead of performing a time-consuming extraction of layout information, a conservative approximation can be made that two nets can be shorted if they occupy the same FPGA tile or tiles anywhere on the device. A tile is a block of the layout if the layout is divided into a grid pattern. Nets that occupy the same FPGA tile will not be put in the same group of nets. Each net that occupies the same FPGA tile will be put into a different net group. Using tile information to determine which nets to test together provides a very realistic fault model.

The improvement in the number of nets that can be tested at a time is due to the programmability of the LUT as a shift register, recognizing or partitioning which groups of nets can be tested simultaneously, and bypassing the use of the physical layout for determining which nets could potentially be shorted by using FPGA tile information instead.

Although the present invention has been described above with particularity, this was merely to teach one of ordinary skill in the art how to make and use the invention. Many additional modifications will fall within the scope of the invention, as that scope is defined by the following claims.

What is claimed is:

1. An apparatus for testing for bridge faults in nets of a programmable integrated circuit, the apparatus comprising:
   a plurality of nets organized in groups;
   function generators configured as clocked shift registers such that each of the plurality of nets is sourced by a function generator, wherein for each net group:
      shift registers coupled to nets in the net group are initialized identically to one value;
      shift registers coupled to nets in the net group are initialized to a different unique value than shift registers coupled to nets in other net groups; and
      each shift register in the net group stores one bit with a value of one and with zeros in all other bits so that when clocked, each shift register provides a single one on one clock cycle and provides zeros in all other clock cycles; and
   a test device to couple to net groups to test the net groups after each clock cycle, such that the test device provides an indication when a short is detected between net groups.

2. The apparatus of claim 1, wherein the test device indicates a short is detected at the end of n clock cycles, where n is the length of the shift register, when the load on any net has a value that is different from the value provided by the net's corresponding shift register.

3. The apparatus of claim 1, wherein each shift register instead stores one bit with a value of zero and with ones in all other bits so that when clocked, each shift register provides a single zero on one clock cycle and provides ones in all other clock cycles.

4. The apparatus of claim 1, wherein the test device indicates a short is detected for a first net group having nets coupled to shift registers outputting a one value after a clock cycle when the first net group load receives a value of zero.

5. The apparatus of claim 4, wherein the short is located between the first net group and an adjacent net group.

6. The apparatus of claim 1, wherein the test device indicates at least one short is detected for one or more of the net groups having nets coupled to the shift registers outputting zero values after a clock cycle when one or more loads of the net groups receive a value of one.

7. The apparatus of claim 6, wherein the short is located between one of the net groups having a load with a value of one and an adjacent net group.

8. The method of claim 1, wherein the groups comprise one to n groups of at least one of the nets for a shift register length of n.

9. The apparatus of claim 1, wherein each of the shift registers comprises multiple shift registers that are cascaded.

10. The apparatus of claim 1, wherein the test device is coupled to I/O port pads of the programmable integrated circuit.

11. The apparatus of claim 1, wherein each of the plurality of nets has at least one load.

12. The apparatus of claim 1, wherein the shift registers for the net groups are initialized in one of ascending order and descending order.

13. The apparatus of claim 1, wherein when a portion of the plurality of nets occupies a same tile on the programmable integrated circuit, the portion of the plurality of nets can be shorted to each other and are not part of the same net group.

14. A method of testing for bridge faults in nets of a programmable integrated circuit, the method comprising:
   grouping a plurality of nets;
   configuring function generators as shift registers such that each of the plurality of nets is sourced by a function generator, wherein the configuring comprises for each net group:
      initializing identically to one value shift registers coupled to nets in the net group;
      initializing shift registers coupled to nets in the net group to a different unique value from shift registers coupled to nets of other net groups; and
      storing in each shift register of the net group one bit with a value of one and with zeros in all other bits in nets of the programmable integrated circuit so that when clocked, each shift register provides a single one on one clock cycle and provides zeros on all other clock cycles;
   clocking the shift registers; and providing an indication with a test device coupled to the net groups when a short is detected between net groups by testing the net groups after each clock cycle.

15. The method of claim 14, wherein the providing an indication with the test device comprises indicating a short is detected at the end of n clock cycles, where n is the length of the shift register, when the load on any net has a value that is different from the value provided by the net's corresponding shift register.

16. The method of claim 14, wherein the storing comprises storing in each shift register of the net group one bit with a value of zero and with ones in all other bits so that when clocked, each shift register provides a single zero on one clock cycle and provides ones on all other clock cycles.

17. The method of claim 14, wherein the providing the indication comprises indicating a short is detected for a first net group having nets coupled to shift registers outputting a one value after a clock cycle when the first net group load receives a value of zero.

18. The method of claim 14, wherein the providing the indication comprises indicating one or more shorts are detected for at least one of the net groups having nets coupled to shift registers outputting a zero value after a clock cycle when at least one load of the one or more of the net groups receives a value of one.

19. The method of claim 14, wherein the configuring further comprises cascading multiple shift registers to create each single shift register.

20. An apparatus for testing for bridge faults in nets of a programmable integrated circuit, the apparatus comprising:
   function generators coupled to a plurality of nets, the function generators configured as clocked shift registers, such that each of the shift registers coupled to the plurality of nets is initialized to a different value and stores one bit with a value of one; and
   means for indicating when one of the plurality of nets is shorted based on testing an output of the plurality of nets after each clock cycle.

* * * * *